April 17, 1962 H. J. PAZ ET AL 3,030,586

TRANSISTOR CIRCUIT

Filed Feb. 18, 1955

INVENTORS
HAROLD J. PAZ
FRANCIS P. KEIPER, JR.

BY

[signature]

ATTORNEY

3,030,586
TRANSISTOR CIRCUIT

Harold J. Paz, Philadelphia, and Francis P. Keiper, Jr., Elkins Park, Pa., assignors, by mesne assignments, to Philco Corporation, Philadelphia, Pa., a corporation of Delaware Filed Feb. 18, 1955, Ser. No. 489,153
11 Claims. (Cl. 330—19)

The present invention relates to electrical-signal translating devices, and particularly to transistor amplifying circuits.

One important general category of amplifying devices is that of linear D.C. amplifiers, where the designation "D.C." indicates that the applied signals are direct-coupled through the amplifier, as opposed to A.C.-coupled, and the term "linear" refers to the common adjustment of such circuits in accordance with which the output signals thereof possess instantaneous amplitudes substantially proportional to those of the applied input signals, in contradistinction to switching circuits, for example, in which the output signal typically can possess only two or possibly three different values in response to input signal variations; however, it is generally understood, and is to be understood hereinafter, that the designation of the D.C. amplifier as linear does not restrict this class of amplifiers to those in which the output is accurately and precisely proportional to the input signal at all times, as will be recognized by those skilled in the art. The general purposes and advantages of such linear D.C. amplifiers are well known; some of their more outstanding characteristics are their excellent low frequency response, quick overload-recovery time and small number of circuit components.

However, one drawback of such linear D.C. amplifiers has been the requirement for different supply voltages for the active elements of successive stages, imposed because the output voltage level of the active element of one stage differs substantially from the level appropriate for the input to the next active element. For example, in a vacuum tube D.C. amplifier the plate-to-cathode voltage must ordinarily be much higher than the grid-to-cathode voltage in order to obtain gain, and direct connection of the plate of one tube to the grid of the next is therefore not possible unless additional biasing elements are employed. A similar situation has existed in the transistor field, in that it has not been deemed possible to direct-couple similar grounded-emitter stages unless some special voltage-compensating means are employed which not only add to the circuit complexity but also place an ultimate limit on the number of stages which can be so coupled.

Accordingly, it is an object of our invention to provide an improved direct-coupled amplifying circuit.

Another object is to provide a linear D.C. amplifier which utilizes transistors as the active elements and requires but very few circuit components.

A further object is to provide a linear D.C. amplifier suitable for small-signal amplification with small power consumption.

It is another object to provide a linear D.C. transistor amplifier which may possess as large a number of stages as desired, and in which the same supply voltages may be used for each stage thereof.

It is also an object to provide a new form of transistor amplifying stage which is highly advantageous in certain applications.

The above objectives are achieved in accordance with the invention in one aspect by providing a linear D.C. transistor amplifier comprising a plurality of grounded-emitter transistor stages in cascade, with the collector of one stage direct-coupled to the base of the next stage.

The emitter elements of the transistors in successive stages are preferably biased at substantially the same potential, and the collector elements thereof may also be supplied with a bias potential which is substantially the same for all transistors. However, if desired, the emitter element of a later stage may even be biased somewhat more positively than the emitter element of the immediately preceding stage when the transistors are of the type having N-type base regions, or may be biased somewhat more negatively when the transistors are of the type having P-type base regions; the collector elements of different stages may also be supplied with differing biases, if desired. By suitable adjustment of the voltage supplied to the collectors and bases from the source of supply potential, and by appropriate adjustment of the bias of the first transistor of the chain, each transistor may be operated in its linear active range, provided that at least some of the transistors employed are of a select type meeting certain definite specifications as determined by the following considerations.

First, such a select transistor suitable for use in our linear D.C. amplifier should possess a relatively low base current at a given base-to-emitter voltage in the grounded emitter configuration, a condition which we have determined exists in transistors in which the emitter-to- base rectifier is characterized by a low value of reverse saturation current. We have found such characteristics to a marked degree in the surface-barrier type of transistor described for example in the copending application Serial No. 472,826 of R. A. Williams and J. W. Tiley, entitled "Electrical Device," and filed December 3, 1954; similar characteristics have also been found in silicon alloy-junction transistors of certain types, and in a relatively small percentage of experimental germanium alloy-junction transistors.

Moreover, we have found that a transistor of this select type may be operated as a single-stage amplifier in the linear mode with its collector biased substantially at base potential or even somewhat in the forward direction with respect to the base, provided the characteristics of the transistor meet certain requirements as will be described in further detail hereinafter. Utilizing stages of this general character in which the base and collector may be operated at the same potential, we have found that any number of stages may be cascaded with direct coupling, with no theoretical limit on the ultimate number which may be employed. Furthermore, such a novel transistor stage is of general utility in itself and may be used for other purposes, as will also be set forth more fully hereinafter.

In a preferred embodiment, our invention may comprise a linear D.C. amplifier made up of only the number of transistors required to produce the desired gain, one resistor per transistor for supplying collector and base potential, an input resistor for adjusting the bias of the first base and a source of supply potential for all of the transistors. Such a circuit is of particular utility in connection with hearing aids in which compactness, low power consumption and small number of circuit elements are of primary importance, although the circuit arrangement is also useful in any of many other widely differing applications as well.

Other objects and features of the invention will be more readily comprehended from a consideration of the following detailed description in conjunction with the accompanying drawings, in which.

Figure 1:
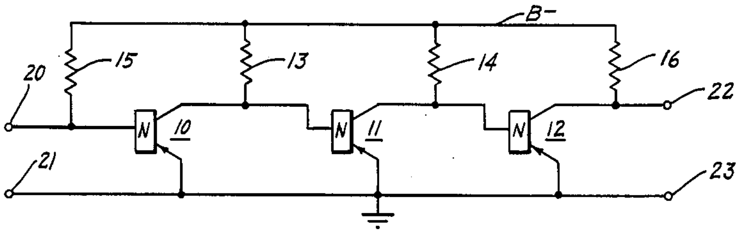
FIGURE 1 is a schematic diagram of a simple form of a linear D.C. amplifier in accordance with the invention.

Referring now to FIGURE 1 in detail, the embodiment of the invention there shown comprises a three-stage linear D.C. amplifier utilizing only three transistors 10, 11 and 12, two interstage resistors 13 and 14, an input resistor 15, an output resistor 16 and a source of supply potential designated B⁻, together with appropriate interconnections as shown. The emitter of each transistor is directly connected to a source of reference potential designated as ground in the figure, and the collector of transistor 10 is directly coupled to the base of transistor 11 while the collector of transistor 11 is in turn directly connected to the base of transistor 12. The interstage resistors 13 and 14 are connected between the source of negative potential B⁻ and the interconnection of transistors 10 and 11 and 11 and 12, respectively. Input resistor 15 is connected between the base of transistor 10 and B⁻, while the output resistor 16 is connected between the collector of transistor 12 and B⁻. Input signals may be applied between input terminals 20 and 21, and amplified output signals may be taken from output terminals 22 and 23.

In the embodiment shown in FIGURE 1, transistors 10, 11 and 12 may be substantially identical, as may be the interstage resistors 13 and 14. Input resistor 15 and output resistor 16 may then have such values as are required to maintain the three transistors at substantially the same collector-voltage level in the absence of applied signals at terminals 20 and 21. Assuming that the resistive impedance of the signal source connected to input terminals 20 and 21 is high, as will be the case for example with capacitive coupling, resistor 15 will ordinarily be substantially larger than interstage resistors 13 and 14 and in any event is such as to bias the first transistor 10 intermediate its cutoff and saturation conditions and in its substantially linear, active range of base voltages. The output resistor 16 may possess whatever value is desired for maintaining the collector voltage of the third transistor 12 in the region of linear operation and for obtaining the required output signal.

Further in accordance with the invention, at least transistor 11 and preferably all three transistors 10, 11 and 12 are of a type which we have determined will provide susbtantially linear, small-signal amplification with its base and collector electrodes at substantially the same potential, or even with the collector biased in the relatively more conductive condition with respect to the base. In the present example each of the three stages may be operated in substantially the same condition of bias and collector current, and the base voltages of the three may be substantially the same, as may be the collector voltages. With such an arrangement, since the collector of each transistor is directly connected to the base of the next transistor, the collector voltage of each transistor is also substantially equal to its own base voltage. By suitable choice of the supply voltage B⁻ and of the bias supplied to the base of the first transistor, the collector and base voltages of each transistor are adjusted into the linear, active range, and the entire assembly then serves as a linear D.C. amplifier of relatively large gain and bandwidth.

The necessary properties of the transistors employed in this form of the invention and the manner of adjustment of the circuit will be appreciated from the following considerations. In the past, transistors have been thought of as providing a substantial short-circuit from base to emitter in comparison to the high resistance of the collector, and such has in fact been the case in the early forms of transistors as well as in the great majority of transistors which have heretofore been available commercially. Direct coupling of transistors to produce linear amplification without special biasing circuits has therefore been considered as out of the realm of possibility, as in vacuum tube circuitry. However, we have found that the base-to-emitter voltage, per unit current between base and emitter, may be relatively high in certain types of transistors and that this voltage may in fact be sufficiently high that the normal operating range of base voltages will include values which, when utilized as the collector voltage of a transistor, provide amplification in the linear mode. Furthermore, these values of voltages may be applied to the base and collector of the same transistor, and that transistor will then provide gain even though its collector is not reverse-biased with respect to base as has heretofore been considered necessary. We have in fact found that, with the type of transistor which we prefer to employ, the collector may even be biased substantially in the forward direction with respect to the base and linear amplification still obtained.

Figure 2:
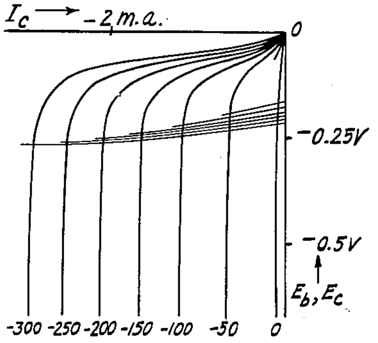
FIGURES 2, 3 and 4 are graphical representations to which reference will be made in explaining the transistor properties required for operation of our novel linear amplifier.

The nature of the characteristics of a transistor of the general class which we prefer to employ are shown in FIGURE 2, wherein it will be understood that the curves shown are illustrative only and are not intended to be accurately representative of the exact values of current and voltage for any particular transistor. In this example the transistor characteristics are those of a surface-barrier transistor, of the type referred to in the above-cited copending application of Williams and Tiley. The particular surface-barrier transistor whose characteristics are shown utilizes N-type germanium of approximately 1 ohm-centimeter resistivity as the base material, and emitter and collector contacts of indium in substantially circular form having respective diameters of about 4 and 7 mils and a separation of approximately 0.2 mil between their substantially parallel opposing faces. The lines in FIGURE 2 extending downwardly and identified by the numbers —50, —100, —150 etc. are the so-called common-emitter collector characteristics of the transistor obtained by plotting the variation of collector voltage with collector current for various fixed values of base current. The lines extending generally horizontally are the so-called base characteristics of the transistor, and indicate the manner in which the base voltage varies as the collector characteristics are produced. Thus, ordinates in FIGURE 2 represent the collector voltage or base voltage of the transistor in volts, while abscissae represent the corresponding collector current in milliamperes. The first collector-voltage curve to the left of the ordinate axis designated by the number 0 is obtained with a base current of zero microamperes, and successive collector curves to the left of this curve correspond to base current increments of —50 microamperes, as represented by the above-mentioned identifying numbers.

The base voltage characteristics also comprise a family of curves, one corresponding to each of the several values of base current utilized in obtaining the collector characteristics. For example, the lowest base voltage curve, which also extends farthest to the left and terminates immediately above the vertical portion of the —300 microamperes collector voltage curve, is produced with —300 microamperes of base current. The base-voltage curves for progressively smaller values of base current are progressively higher on the graph, and in each case terminate immediately above the vertical portion of the collector characteristic which is obtained for the same value of collector current.

By plotting the collector and base characteristics on the same graph in this manner and with the same collector current scale, the existence or non-existence of the attributes desired in a transistor suitable for use in a linear D.C. amplifier such as that of FIGURE 1 is readily displayed and determined. First as to the operating range of base voltages of the transistor, this operating range lies between zero and the negative voltage of the lowest base-voltage characteristic curve. It will be understood that the lowest curve shown in the graph is not necessarily precisely identical with the very lowest which can be obtained with that transistor, but it is noted that the base voltage curves are spaced closer and closer together as they progress farther downward in the negative voltage direction, and that extremely large increases in base current are therefore required to move the base voltage appreciably below the lowest position shown in the figure. The use of such extremely large currents is limited by the power and current-handling capabilities of the transistor, as well as by minority-carrier saturation, and the range of base voltages shown in the figure is therefore representative and sufficiently accurate for the present purpose.

Accordingly, the base-voltage curves of the transistor as shown in FIGURE 2 indicate that base voltages as large as from about —0.2 to —0.25 volt are readily obtained, with base currents of less than —300 microamperes and collector currents of less than —3 milliamperes. At the same time, the collector characteristics indicate that the collector current of the transistor at —0.2 volt is in its substantially linear region, below the knee or bend in the collector current characteristics. With this type of transistor then, the operating range of base voltages is sufficiently great to include values suitable for operating the collector of a similar transistor in its linear region. This condition is indicated by the passage of the base-voltage curves through linear portions of the collector characteristics.

Figure 3:
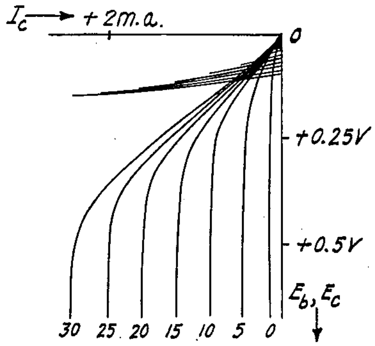
Figure 4:
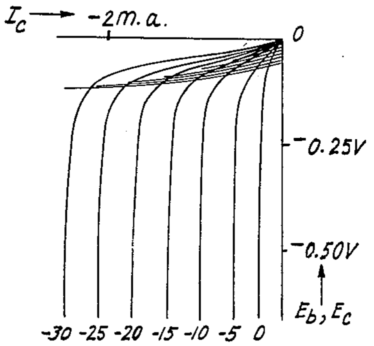

The corresponding relationships for a typical grown-junction transistor and for a typical germanium alloy-junction transistor are shown in FIGURES 3 and 4 respectively. In the case of the grown-junction characteristics shown in FIGURE 3, the transistor is of the NPN type and the direction of ordinates and abscissae are therefore reversed from the directions in FIGURE 2. In addition, the various curves of both the collector and base-voltage families are plotted for increments of 5 microamperes rather than 50 microamperes, and in the case of the grown junction characteristics of FIGURE 3 these increments are of course in the positive-current direction as indicated; however, in other respects the ordinates and abscissae of the FIGURES 3 and 4 are the same as those in FIGURE 2.

From FIGURE 3 it will be seen that the base-voltage curves of the typical grown-junction transistor intersect the collector characteristics only in the highly non-linear region, and that attempts to increase the base voltage above about 0.15 volt will result in excessive current without producing base voltages within the linear range of collector voltages for that transistor. In the case of the germanium alloy-junction transistor whose characteristics are shown in FIGURE 4, the base voltage approaches more closely to that permitting linear operation, but the base-voltage curves still intersect the collector characteristics in a region of very substantial curvature and such a transistor is therefore not suited for normal small-signal, linear operation.

Accordingly, of the three types of transistors whose characteristics are represented in FIGURES 2, 3 and 4, the surface-barrier transistor having the characteristics shown in FIGURE 2 comprises a select transistor of the class suitable for use in linear D.C. amplifiers of the type shown in FIGURE 1. It possesses a relatively large range of permissible base voltages, together with collector characteristics having linear regions within the permissible range of base voltages, and, in fact, at voltages exactly equal to the base voltage. It is for this reason that the collector voltage of one such transistor is appropriate for the base voltage of another transistor coupled directly thereto, and vice versa, whereas for a transistor having the characteristics shown in FIGURE 3 limitations on the maximum-permissible base current prevent the operating range of base voltage from extending into the linear portions of the collector characteristics, and there is no single voltage suitable for both collector and base.

In addition to the discovery of these properties in certain select transistors, such as the surface-barrier transistor having the characteristics shown in FIGURE 2, we have found, as mentioned hereinbefore, that the collector of a transistor of this select type may be operated in its linear range with its collector voltage equal to or smaller than its base voltage, in which condition the collector is biased at zero or in the forward direction with respect to the base. With these properties in mind, the operation of the circuit shown in FIGURE 1 will be more readily understood.

As an example, in the circuit of FIGURE 1 resistors 13 and 14 may each have a value of 2,700 ohms and resistor 16 may be equal in value to resistors 13 and 14, but to permit a greater amplitude of current swing resistor 16 is preferably of smaller value, for example 1,500 ohms. Assuming that the input signal is coupled to terminal 20 from a high-resistance source, and assuming a typical collector-to-base current gain of about 30 for transistor 10, input resistor 15 may have a value of about 82,000 ohms. Utilizing surface-barrier transistors of the type described hereinbefore and having characteristics of the general form described with reference to FIGURE 2, and with a supply potential of —1.5 volts, the collector and base voltages for transistors 10 and 11 may each be about —0.18 volt while the collector of transistor 12 is at approximately —0.75 volt. Under these conditions, each of the transistors 10 and 11 is biased in a linear portion of its collector characteristic with —0.18 volt on the collector, while its base is in its normal operating-voltage range at this same potential. The three emitters in this instance are at the same potential, namely ground. With these values, a signal variation having an amplitude of the order of 0.70 volt may be produced between output terminals 22 and 23 in response to input signals at terminals 20 and 21 having amplitudes of the order of 0.35 millivolt, indicating an average gain of approximately 22 db per stage for this particular arrangement. It will be understood that with transistors having current gains greater than 30, correspondingly greater values of over-all gain are obtained. Furthermore, since direct-coupling is employed the low-frequency response of the amplifier extends downward to zero cycles per second; the high-frequency response is limited only by the physical properties of the transistors and typically extends upward to at least a half-megacycle, providing an extremely wide passband.

If one attempts to utilize in the circuit of FIGURE 1 a transistor such as the grown-junction transistor whose characteristics are represented in FIGURE 3, the base voltages of the transistors will be limited substantially to the greatest negative value of base voltage shown in FIGURE 3, the collector voltage of the transistor directly connected to that base will therefore be much too low for linear operation, and high distortion and in some cases a gain of less than unity will be obtained. This is primarily because the maximum operating base voltage for such a transistor type is not within the linear range of collector voltages for any known transistor type, and certainly not within that for the same transistor type.

As for what physical types of transistors possess the desired characteristics, surface-barrier transistors of the above-described type, both of germanium and silicon, generally possess this property to a marked degree, as do most silicon junction-transistors. Most germanium alloyed-junction transistors do not possess this characteristic, or are at best marginal in this respect; thus only a very small percentage of commercial germanium alloyed-junction transistors have been found usable for this purpose. Known forms of grown-junction transistors presently do not appear to possess the desired properties at all. However, it will be understood that where the above-described electrical characteristics are found in alloyed or grown junction transistors, either in their present forms or in improved forms not presently available, such transistors may also be utilized in the circuitry of the invention.

Although the natures of all of the physical parameters of a transistor which contribute to the desired characteristics are not fully understood, at least among surface-barrier transistors it appears to be necessary that the reverse saturation currents of both the collector and emitter diodes be low; a low saturation current for the emitter diode has been found to provide a large range of permissible base voltages, for a given limitation on maximum base current, while a low collector saturation current provides linear operation at relatively low collector voltages. Although not essential for direct-coupled operation, to obtain best base-voltage linearity in the operating range it also appears to be desirable that the reverse alpha of the transistor be relatively high. Typical values for these parameters in the case of the surface-barrier transistor referred to hereinbefore are an emitter reverse-saturation current of 0.2 microampere, a collector reverse saturation current of 0.4 microampere and a reverse alpha of 0.8. However, in any case the existence of the pertinent properties required for operation in accordance with the invention may be determined by means of the characteristic curves of the transistor in the manner described hereinbefore.

As will be apparent from the foregoing, since transistors of the specified type can be operated in their linear mode with high gain when base and collector are at the same potential, as many identical stages as may be desired may be connected in cascade using a single supply of low potential, and in this sense such a stage is therefore an iterative stage. Furthermore, since satisfactory operation may also be obtained with the collector biased appreciably in the forward direction with respect to the base, exact identity of stages is not necessary and normal variations in the values of circuit components are therefore accommodated. By reason of this same property, the emitters of a limited number of successive stages may also be biased progressively further in the forward direction, as by using interstage resistors of progressively larger values or by adding emitter resistors of progressively larger values, as may be done for example to obtain improvement in gain when the source of input signals is of low impedance.

Figure 5:
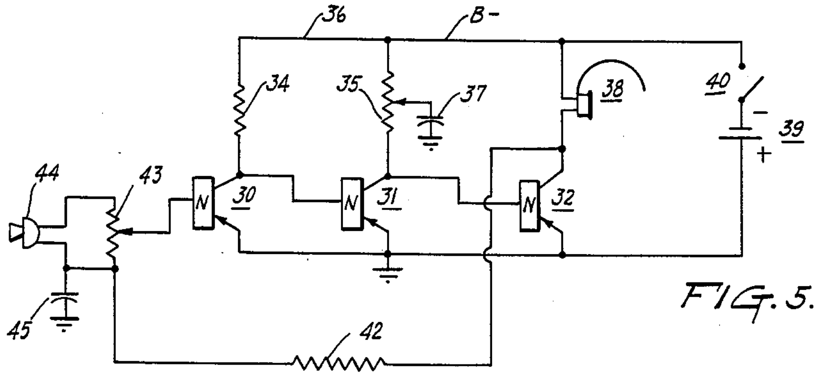
FIGURE 5 is a schematic diagram of a hearing-aid receiver embodying the invention.

One specific, practical application of our invention is shown in FIGURE 5, wherein there is illustrated the complete circuit of a transistor hearing-aid providing about 66 decibels of wide-band audio gain from microphone to earphone, having tone control, volume control, on-off switch and temperature stabilization, requiring but 2.1 milliamperes of current from a −1.5 volt supply and having a passband extending from less than 50 cycles per second to about one-half megacycle exclusive of the microphone and earphone frequency characteristics.

The basic elements of the circuit are the three cascaded grounded-emitter transistors 30, 31 and 32, each of which are of the surface-barrier type having low reverse-saturation currents of the order of 0.3 microampere for both emitter and collector diodes, and current gains of about 0.97 or more. Such transistors may be of the type referred to hereinbefore and may be fabricated by the methods described in the copending application Serial No. 472,824, of J. W. Tiley and R. A. Williams for "Semiconductive Devices and Methods for the Fabrication Thereof," filed December 3, 1954. Each transistor has its emitter grounded, and the collectors of transistors 30 and 31, respectively, are direct-coupled both to the bases of transistors 31 and 32 and, by way of fixed resistor 34 and variably-tapped resistor 35, to a supply line 36 of negative potential designated B−. A capacitor 37 is connected between ground and the variable tap of resistor 35 to permit selective attenuation of high-frequency signal components and hence tone control by variation of the position of the tap. The collector of the final transistor 32 in the cascade chain is connected with supply line 36 by way of the hearing-aid earphone 38, in which the final audible signals are to be produced; the resistance of the inductive driving element of the earphone 38 therefore determines primarily the operating point of the collector circuit of the final stage. The negative potential for supply line 36 is provided from battery 39 by way of single-pole, single-throw, on-off switch 40.

Bias for the base of the first transistor 30 is provided by a temperature-compensating feedback connection from the collector of the final transistor 32 by way of fixed feed-back resistor 42 and variably-tapped resistor 43, the tap of which supplies the base potential for transistor 30. Such temperature compensation is desirable in many commercial applications when germanium transistors are used, but is not essential when silicon transistors are employed. A microphone 44 is connected across resistor 43 and a capacitor 45 is provided between ground and the junction of resistors 42 and 43. By varying the position of the tap on resistor 43, volume control is achieved.

When switch 40 is closed, operating biases are supplied to each of the three transistors. The values of resistors 34, 35, 42 and 43, and the resistance of earphone 38 are chosen to provide biasing in the linear range of operation in accordance with the foregoing teachings. However, in the present embodiment the bias of the base of the first transistor 30 is derived not from the supply potential but from the collector potential of the final transistor 32. With this connection, if the collector current of transistor 30 rises gradually due to an increase in temperature for example, the collector potential of transistor 32 and therefore the base voltage of transistor 30 becomes more positive, opposing and reducing the above-mentioned increase in collector current of transistor 30. This connection therefore serves to stabilize the bias points of the transistors against changes due to temperature variations.

The function of capacitor 45 is to reduce the degenerative feedback of the stabilizing network for audio-frequency signals, which it accomplishes by providing a low-impedance path to ground for signals having frequencies greater than the rate at which slow variations in ambient temperature occur. The larger the value of capacitor 45, the better is the low-frequency response of the amplifier, the size of capacitor 45 being limited principally by practical considerations of cost and size.

In one specific example, appropriate values for the several elements of the circuit of FIGURE 5 are as follows:

| | |
|---|---|
| Resistor **34** | 3,300 ohms |
| Resistor **35** | 2,000 ohms |
| Resistor **42** | 68,000 ohms |
| Resistor **43** | 2,000 ohms |
| Capacitor **37** | 0.5 microfarads |
| Capacitor **45** | 10 microfarads |
| Resistance of earphone **38** | 300 ohms |
| Impedance of earphone **38** | 400 ohms at 1,000 cycles |
| Impedance of microphone **43** | 1,000 ohms at 1,000 cycles |
| Voltage of battery **39** | —1.5 volts |

In this example the collector resistances are progressively smaller for succeeding stages, and as a result transistors 31 and 32 are operated with their collectors biased slightly in the reverse direction so that marginal transistors such as certain of the better germanium alloy-junction transistors may be used in this circuit which would not provide sufficiently linear operation with identical collector resistors. Thus the bias voltage of the base of transistor 30 is about −0.18 volt and that of the collector of transistor 30 and the base of transistor 31 is about −0.21 volt, so that the collector of transistor 31 is biased slightly negatively with respect to the base thereof, by about −0.03 volt. In this example the collector voltage of transistor 32 is about —1.1 volts, and acoustical variations impingent upon microphone 44 are capable of producing undistorted current variations in earphone 38 as much as one milliampere in amplitude.

Figure 6:
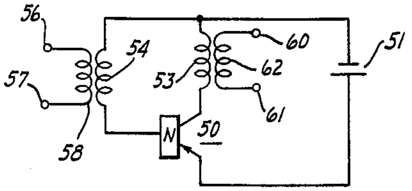
FIGURE 6 is a schematic diagram of a single transistor stage also embodying the invention in one of its aspects.

In FIGURE 6 there is shown a simplified circuit embodying our discovery that a transistor stage may be operated as a linear amplifier with collector and base at the same bias potential, but in which this feature is used to provide simplicity in the arrangement of the bias supplies rather than to accomplish direct coupling. Transistor 50, connected in the grounded emitter configuration, may be of the select class described above, preferably of the surface-barrier type. A battery 51 supplies substantially the same potential to both collector and base of transistor 50, by way of transformer windings 53 and 54 respectively. Input signals at terminals 56 and 57 are supplied to the base by inductive coupling from coil 58 to coil 54, and amplified output signals are provided at terminals 60 and 61 by inductive coupling of coil 53 to coil 62. Since the same supply potential serves for both base and collector, additional biasing elements are unnecessary and an especially simple form of transformer-coupled stage is obtained.

Although the invention has been described with particular reference to specific embodiments, it will be understood that it may also take any of a variety of widely-differing forms without departing from the scope thereof. For example, transistors having P-type base material may be utilized in place of the transistors shown, with appropriate reversal of the polarities of supply potential in a manner which is well known in the art. Furthermore, the number of stages used may be less than the three illustrated or many times more, and if negative feedback is employed it may be provided between other elements than those shown, for example between the emitters of the several stages by means of resistance common to the emitter circuits of a plurality of stages. Further by way of example, and as will appear from FIGURE 5, the interstage circuit elements need not be pure resistances but may possess reactive impedance components as well, when advantageous or necessary. Finally, although we have specified several types of transistors in which the characteristics required for operation in accordance with the invention are commonly found, any transistor type having the electrical characteristics set forth hereinabove may be employed. For example, it appears that germanium alloyed-junction transistors approach the desired characteristics as improvements are made in reducing the reverse saturation currents of the emitter and collector diodes thereof, and that such transistors may therefore become of general applicability as such improvements continue.

We claim:

1. A transistor amplifying circuit comprising a first grounded-emitter transistor stage including a first transistor having at least emitter, collector and base elements, a second grounded-emitter stage including a second transistor also having at least emitter, collector and base elements, the emitter diode of said second transistor being characterized by a reverse saturation current of less than substantially one microampere, means biasing the emitter elements of said first and second transistors at substantially the same potential, a direct connection from the collector element of said first transistor to the base element of said second transistor, means for biasing said collector elements of said first and second transistors at the same potential, and means for applying between the base and emitter elements of said first and second transistors a potential biasing said first and second transistors in their linear amplifying condition.

2. A transistor amplifier circuit comprising a plurality of transistors each having at least emitter, collector and base elements and each characterized by an operating range of base-to-emitter voltages including voltages within the range of collector-to-emitter voltages providing linear operation of said transistors, a potential source having a first pole at a first potential and a second pole at a second potential, a plurality of resistors connecting said collector elements of said transistors to said first pole and supplying said collector elements with a common bias potential, means connecting said emitter elements directly to said second pole, direct collector-to-base connections for arranging said transistors with their signal paths in a cascade chain, and means for varying the base-to-emitter potential of the first transistor in said chain within a range of voltages intermediate that producing collector-current cutoff and minority-carrier saturation in said last-named transistor.

3. A linear transistor amplifier comprising a plurality of transistors of the same conductivity-type each arranged in the common-emitter circuit configuration, means comprising a direct connection from the collector element of one of said transistors to the base element of another of said transistors, means maintaining the emitter elements of said transistors at substantially the same potential, means biasing the collector elements of said transistors at substantially the same potential, each of said transistors being characterized by an operating range of base-to-emitter voltages including voltages within the linear active range of collector-to-emitter voltages of the same transistor, and means for supplying signals between said base and said emitter elements of said one transistor to operate said one transistor in its linear amplifying mode.

4. A transistor circuit comprising a transistor having at least emitter, collector and base electrodes and characterized by an operating range of base-to-emitter electrodes voltages including voltages within the linear active range of collector-to-emitter electrodes voltages thereof, means for applying between said base electrode and said emitter electrode a base biasing voltage within said operating range and within said range of linear active collector-to-emitter voltages, means for applying between said collector electrode and said emitter electrode a collector biasing voltage of the same polarity but smaller than said base biasing voltage to bias said collector electrode in the polarity of easier conduction with respect to said base electrode, means for supplying input signals between said base and emitter electrodes to operate said transistor as a linear amplifier, and means for deriving amplified output signals from said collector and emitter electrodes in response to said input signals while said base biasing voltage and said collector biasing voltage are applied.

5. A transistor linear D.C. amplifier comprising a first transistor having emitter, collector and base electrodes, means for applying to said base electrode a biasing voltage with respect to said emitter electrode such as to forward bias said emitter electrode, means for applying to said collector electrode a biasing voltage with respect to said emitter electrode which is of the same polarity as said base biasing voltage, said base biasing voltage having a magnitude at least as great as that of said collector biasing voltage, a second transistor of the same conductivity type as said first transistor and also having emitter, collector and base electrodes, means directly connecting said collector electrode of said first transistor to said base electrode of said second transistor, means biasing said emitter electrodes at substantially the same potential, means for varying the base-to-emitter current of said first transistor within its linear range, and means for detecting variations in the collector current of said second transistor.

6. A transistor linear amplifying circuit comprising a transistor having at least emitter, collector and base electrodes and characterized by an operating range of base-to-emitter voltages including voltages within the linear active range of collector-to-emitter voltages thereof, means for applying between said base electrode and said emitter electrode a base biasing voltage within said operating range and within said range of linear active collector-to-emitter voltages, means for applying between said collector electrode and said emitter electrode a collector biasing voltage of the same polarity as said base biasing voltage, said base biasing voltage having a magnitude at least as great as that of said collector biasing voltage, means for applying signals between said base electrode and said emitter electrode, said signals being sufficiently small to operate said transistor in its linear amplifying mode, and means for deriving an amplified output signal from said collector and emitter electrodes while said base biasing voltage is applied.

7. The circuit of claim 6, in which said transistor comprises a base of N-type semiconductive material and in which said base electrode is biased at least as negatively as said collector electrode with respect to said emitter electrode.

8. A circuit in accordance with claim 6, in which said collector and base electrodes are biased at the same potential and said transistor is arranged in the common-emitter circuit connection.

9. A circuit in accordance with claim 6, in which said means for applying said base biasing voltage comprises a source of bias voltage having two terminals and a first substantially purely reactive, direct-current conductive impedance element connected directly from one of said two terminals to said base electrode, and in which said means for applying said collector biasing voltage comprises a second substantially purely reactive, direct-current conductive impedance element connected directly from said one terminal of said source to said collector electrode.

10. A circuit in accordance with claim 9, in which said first impedance element comprises a transformer secondary winding and said second impedance element comprises a transformer primary winding.

11. A transistor amplifier circuit comprising at least a first transistor, a second transistor and a third transistor, each of said transistors having emitter, collector and base electrodes, a first direct connection from said collector electrode of said first transistor to said base electrode of said second transistor, a second direct connection from said collector electrode of said second transistor to said base electrode of said third transistor, means connecting directly together all of said emitter electrodes of said first, said second and said third transistors, a source of biasing potential having a first pole and a second pole, a first resistor connected directly from said first pole to said collector electrode of said first transistor for supplying operating collector potential thereto, a second resistor connected directly from said first pole to said collector electrode of said second transistor for supplying operating collector potential thereto, said first and second resistors being of equal values, a direct-current conductive impedance element connected directly from said first pole to said collector electrode of said third transistor, means connecting said second pole of said source of biasing potential to each of said emitter electrodes, and means for applying a biasing potential between said base and emitter electrodes of said first transistor, said biasing potential and said resistors being such as to bias each of said transistors in its linear amplifying condition.

References Cited in the file of this patent

UNITED STATES PATENTS

| | | |
|---|---|---|
| 2,569,347 | Shockley | Sept. 25, 1951 |
| 2,663,806 | Darlington | Dec. 22, 1953 |
| 2,809,240 | Freedman | Oct. 8, 1957 |

OTHER REFERENCES

Shea text, "Principles of Transistor Circuits," pages 29, 30–32, 41, 164, 351, 442, published 1953 by Wiley and Sons, New York city.